United States Patent [19]
Bhatt et al.

[11] Patent Number: 5,156,730
[45] Date of Patent: Oct. 20, 1992

[54] ELECTRODE ARRAY AND USE THEREOF

[75] Inventors: Anilkumar C. Bhatt, Johnson City; Michael T. Freeman; John J. Konrad, both of Endicott; Narendra G. Shah, Johnson City, all of N.Y.

[73] Assignee: International Business Machines, Armonk, N.Y.

[21] Appl. No.: 720,677

[22] Filed: Jun. 25, 1991

[51] Int. Cl.$^5$ ............................................. C25D 5/02
[52] U.S. Cl. ................................... 205/118; 204/231
[58] Field of Search ................................. 204/15, 231

[56] References Cited

U.S. PATENT DOCUMENTS

| | | | |
|---|---|---|---|
| 2,486,985 | 11/1949 | Ruderfer | 204/224 R |
| 3,880,725 | 4/1975 | Van Raalte | 204/15 |
| 4,354,914 | 10/1982 | Szeliga | 204/224 R |
| 4,367,123 | 1/1983 | Beck | 204/224 R |
| 4,507,181 | 3/1985 | Nath et al. | 204/15 |
| 4,828,654 | 5/1989 | Reed | 204/23 |

FOREIGN PATENT DOCUMENTS

| | | |
|---|---|---|
| 208499 | 8/1989 | Japan. |
| 418299 | 8/1974 | U.S.S.R. |
| 703285 | 12/1979 | U.S.S.R. |
| 724308 | 3/1980 | U.S.S.R. |

OTHER PUBLICATIONS

Micro-plate/systems, the drilling machines, PCFAB, Feb. 1991, p. 46.

Primary Examiner—T. M. Tufariello
Attorney, Agent, or Firm—Pollock, Vande Sande & Priddy

[57] ABSTRACT

An electrode array containing individual electrode segments having means to electrically bias each of the segments individually and to control the quantity of current supplied to each of the electrode segments individually; and use of the array.

5 Claims, 2 Drawing Sheets

ELECTRODE ARRAY AND USE THEREOF

TECHNICAL FIELD

The present invention is concerned with an electrode array that contains a plurality of individual electrode segments. The present invention provides for obtaining a selected area and configuration of a current profile of the electrode to thereby accommodate different sized and shaped articles to be plated or etched. In one particular aspect, the present invention is concerned with an anode array that is especially suitable for electroplating.

DESCRIPTION OF BACKGROUND ART

In the coating of an article by electroplating, the particular characteristics of the coating will depend upon the size, shape and relative amount of anode material in relation to the area and shape of the article to be plated which acts as the cathode material. Various procedures have been suggested to add, remove, and/or shield anode material in order to adjust the surface ratio of the anode to the cathode for achieving optimum coating characteristics. However, it is often not possible or practical to adjust the surface ratio of the anode to the cathode by such methods.

The problems directed to the quality of the electroplating are especially pronounced when preparing integrated circuit boards and cards where extreme precision and quality are required. Furthermore, problems are encountered in achieving uniform coatings on substrates that have irregular shapes or configurations such as contoured surfaces.

SUMMARY OF INVENTION

The present invention provides an electrode whereby the surface area of the active electrode relative to a particular counter electrode can be readily adjusted. For instance, the present invention overcomes the problem of those prior art plating cells whereby it is necessary to dismantle portions of the cell in order to add, subtract or reconfigure the anode. In addition, the present invention provides for tailoring the electrode in relationship not only to the size of the surface of the counter electrode being treated but also to its shape and/or surface configuration.

In particular, the present invention is concerned with an electrode array that includes a plurality of individual electrode segments. The electrode segments are independently wired and physically separated from each other. Means are provided for electrically biasing each of the electrode segments individually and for controlling the quantity of current to each of the electrode segments individually.

Another aspect of the present invention is concerned with an electroplating apparatus that includes a housing which contains means defining a receptacle for a bath of an electroplating composition. An anode array is positioned within the receptacle to contact the bath. The anode array includes a plurality of individual anode segments. The anode segments are independently wired and physically separated from each other. A support means for supporting at least one article to be electroplated is provided in the receptacle and in the bath at a location spaced from the anode array. Means are provided for electrically biasing each of the anode segments individually and for controlling the quantity of current to each of the anode segments individually. Associated with the support means is means that are operative for electrically connecting the article to be coated to act as a cathode in an electroplating cell.

A still further aspect of the present invention is concerned with a method of electroplating an article. The method includes providing in a housing an anode array, the article to be coated spaced from the anode array and means associated with the article for electrically connecting the article to act as the cathode, and an electroplating bath. The anode array includes a plurality of individual anode segments. The anode segments are independently wired and physically separated from each other. Each of the anode segments is individually biased and the quantity of current supplied to each of the anode segments is individually preselected. An anodic current is conducted from the anode array to thereby electroplate the article.

DESCRIPTION OF VARIOUS AND PREFERRED EMBODIMENTS

To facilitate an understanding of the present invention, the following discussion is concerned with the preferred aspect of the present invention whereby the electrode is an anode to be used in electroplating. However, it should be understood that the electrodes of the present invention can be used as cathodes and the substrate treated as the anode such as in electroetching; whereby, the present invention can provide for control of the etch rate.

The present invention is concerned with an electrode array that comprises a plurality of individual electrode sections. Preferably, but not necessarily the individual electrode segments are substantially equal, if not equal in size and substantially equidistantly, if not equidistantly spaced. In addition, preferably the array includes at least four individual electrode segments and more preferably at least about six individual electrode segments. The maximum number of electrode segments is limited to only the number that can be practically provided and could be a large number of points. In fact, the greater the number of segments, the greater the ability to tailor the process to the particular substrate to be treated. Of course, the individual segments can be arranged horizontally and/or vertically.

The anode for electroplating is preferably constructed of an non-consumable material such as platinized titanium and niobium coated titanium. The anode material should be inert and insoluble in the electrolytic bath employed.

Figure 1:
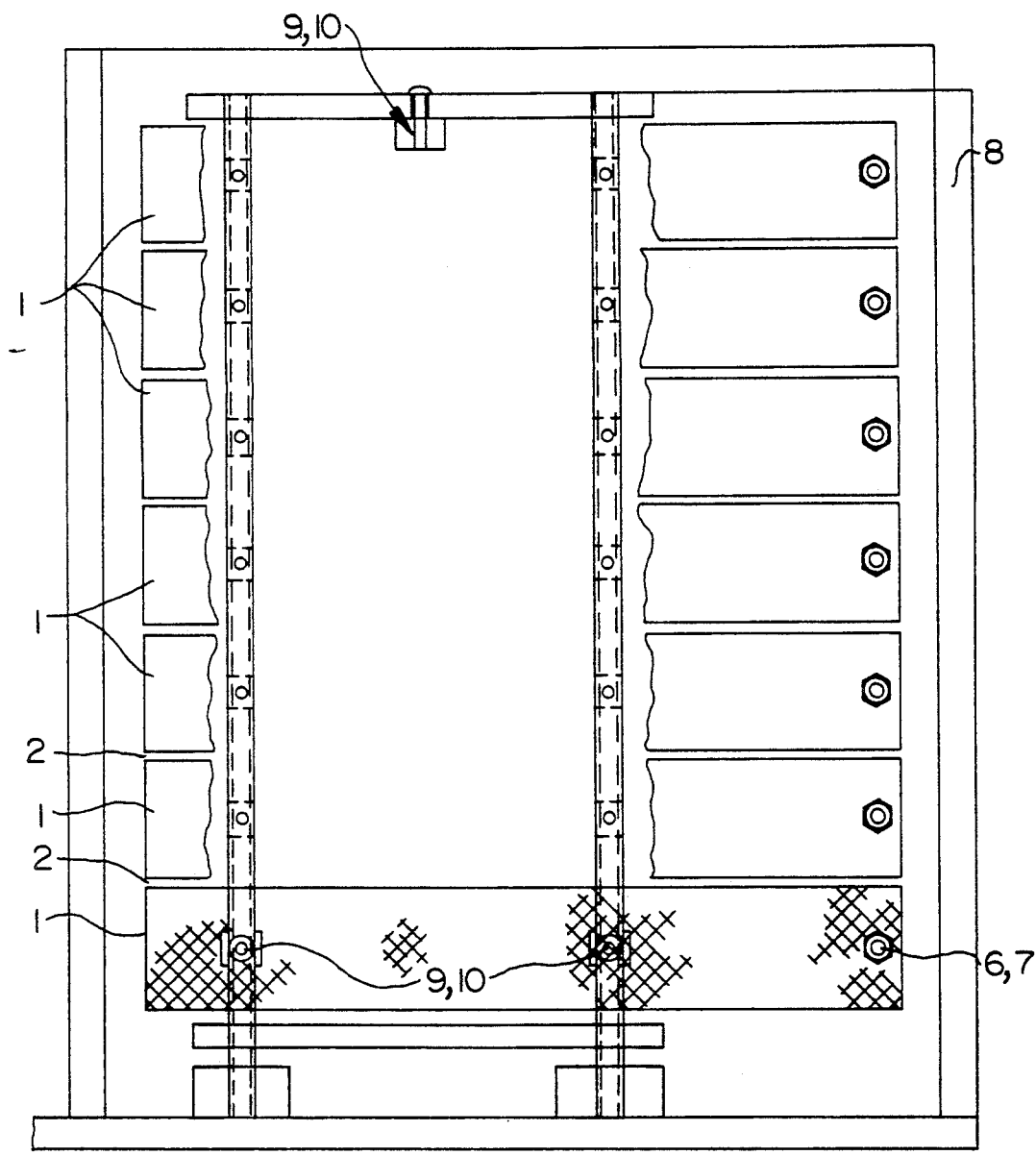
FIG. 1 is a schematic diagram of a electrode array pursuant to the present invention.

Each of the anode segments is individually wired and physically separated from the other anode segments. The anode segments are physically separated from each other by an electrical non-conductor. Reference to FIG. 1 illustrates a schematic of a segmented anode configuration pursuant to the present invention whereby numeral 1 represents the various anode segments physically separated from each other by spacing 2 (i.e.—air acting as the non-conductor).

Each of the anode segments 1 are provided with means to individually electrically bias each segment and to control the quantity of the current supplied to each anode segment. Individually each of the segments can be selectively biased by employing circuitry that contains different sized resistors to change the current along with a simple switching devices. The particular multiplexor circuitry employed would be readily apparent to those skilled in the art once aware of the present disclosure and need not be discussed herein in any further detail.

Power can be supplied to the individual segments 1 from rods or posts 3 (see FIGS. 2 and 3) which are formed of an electrically conducting material such as titanium. Each rod or post 3 is electrically connected to only one anode segment 1 via contact 4 and the hex nut 5 and screw 6 arrangement. The hex nut and screw are of a conducting material such as titanium. Each post 3 is in turn wired to a rectifier (not shown) and then to a power source (not shown). In this manner, a selected current can be supplied to each individual post which in turn supplies the selected current to that segment to which it connects; regardless of the amount of current supplied to any other segment.

Figure 2:
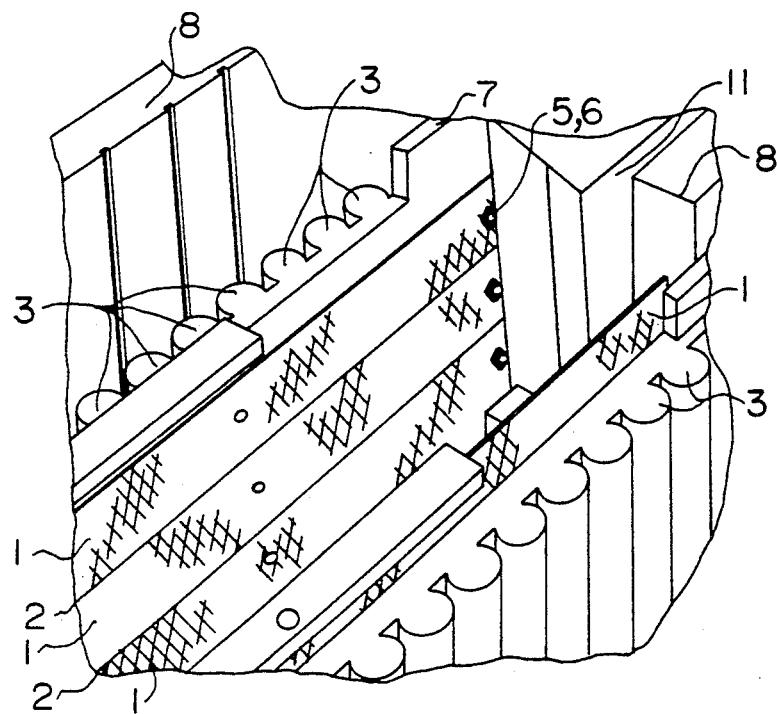
FIG. 2 is a isometric view of an electroplating apparatus employing the present invention.
Figure 3:
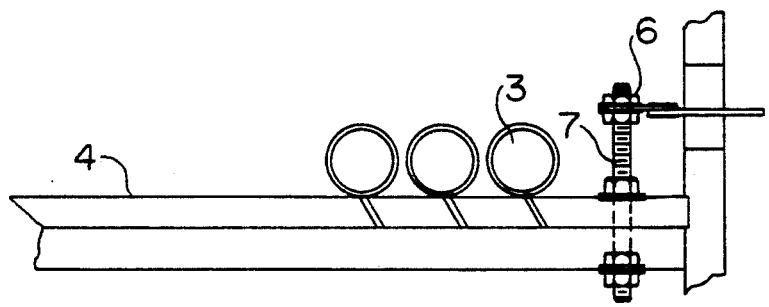
FIG. 3 is a schematic diagram of a partial top view illustrating connections to electrode array.

The particular anode segments 1 shown in FIGS. 2 and 3 are platinized titanium mesh. However, each anode segment can be solid or in any mesh configuration desired.

The anode segments 1 are supported on an insulating rack 7 such as one constructed of chlorinated polyvinyl chloride. The walls 8 of the cell are also constructed of an insulating material such as chlorinated polyvinyl chloride. The anode segments are connected to the rack 7 with screws 9 and top plate 10 arrangements and hex nut 5 and screw 6 arrangements. The hex nut 5 and screw 6 arrangement also act to electrically connect an individual segment to an individual post.

The part or parts to be plated are held between the two anodes shown in FIG. 2 thereby providing plating on both sides. The parts can be held in place by a rack supported in place in groove 11.

Of course, if only one side of a part is to be plated, then the arrangement would include only one electrode.

It is essential to the success of the present invention that all of the anode segments have at least a trickle (e.g.—at least about one-half to about one-third volt) supplied to it during the electroplating process. This is contrasted to an array whereby current is selectively applied to segments in on/off arrangement. It is essential that at least the trickle of charge be applied in order to prevent portions of the anodic segments from becoming cathodic and having plating thereon during the electroplating process. Moreover, by such arrangement a three-dimensional current profile can be achieved pursuant to the present invention whereby the electrical field lines emanating from the anode array can be contoured for different shapes in order to evenly plate on all of the portions of the shaped substrate. The particular configuration of the present invention also makes it possible to tighter control the plating distribution which in turn can result in less cost of the plating composition. The presence of the trickle current provides for greater resolution of the desired coating onto the surface to be coated.

The maximum voltage typically applied to an individual anode segment is usually about three (3) volts.

The anode array of the present invention is preferably presented in a planar format and whereby all parts of the matrix play some role in the profile to be coated. The current density applied to any individual array is typically about one to about 100 amperes per square foot.

According to certain preferred aspects of the present invention, a programmable controller or microprocessor can electrically shape and adjust the required anode configuration on a instantaneous basis to provide for continuous processing where applicable. Any particular microprocessor and program can be readily provided by persons skilled in the art once aware of the present disclosure without undo experimentation.

The present invention can be employed with any electroplating bath the typical being gold electroplating baths for providing coatings onto printed circuit boards or printed circuit cards.

What is claimed is:

1. An anode array comprising a plurality of individual anode segments wherein the anode segments are independently wired and physically separated from each other; and means for electrically biasing each of the anode segments individually with at least a trickle of charge and for controlling the quantity of current to each of the anode segments individually; and wherein said segments are of platinized titanium or niobium coated titanium.

2. The electrode array of claim 1 which comprises at least four individual anode segments.

3. An electroplating apparatus which consists essentially of:
   a housing including means defining a receptacle for a bath of an electroplating composition; an anode array positioned within said receptacle to contact said bath wherein said anode array comprises a plurality of individual anode segments wherein the anode segments are independently wired and physically separated from each other;
   support means for supporting at least one article to be electroplated in said receptacle and in the bath at a location spaced from the anode array;
   means for electrically biasing each of the anode segments individually with at least a trickle of charge during electroplating to thereby prevent the anode segments from beaming cathodic during electroplating, and for controlling the quantity of current to each of the anode segments individually;
   means associated with the support means and operative for electrically connecting the article to act as a cathode in an electroplating cell.

4. The apparatus of claim 3 wherein means are provided to supply at least about $\frac{1}{3}$ volt to each segment during electroplating.

5. A method of electroplating an article which comprising:
   providing in a housing an anode array, the article to be coated spaced from said anode array and means associated with said article for electrically connecting said article to act as the cathode;
   and an electroplating bath;
   and wherein said anode array comprises a plurality of individual anode segments wherein the anode segments are individually wired and physically separated from each other;
   biasing each of the anode segments individually and selecting the quantity of current to supply to each of the anode segments individually, wherein at least a trickle of charge is applied to each anode segment during electroplating to thereby prevent the anode segments from becoming cathodic during electroplating; and
   conducting anodic current from the anode array to thereby electroplate said article.

* * * * *